United States Patent
Mattisson et al.

(10) Patent No.: US 9,081,068 B2
(45) Date of Patent: Jul. 14, 2015

(54) METHOD AND APPARATUS FOR DETERMINING A CAPACITY OF A BATTERY

(71) Applicants: Nils E. Mattisson, San Francisco, CA (US); Thomas C. Greening, San Jose, CA (US); Jeffrey G. Koller, Oxnard, CA (US)

(72) Inventors: Nils E. Mattisson, San Francisco, CA (US); Thomas C. Greening, San Jose, CA (US); Jeffrey G. Koller, Oxnard, CA (US)

(73) Assignee: APPLE INC., Cupertino, CA (US)

( * ) Notice: Subject to any disclaimer, the term of this patent is extended or adjusted under 35 U.S.C. 154(b) by 380 days.

(21) Appl. No.: 13/622,242

(22) Filed: Sep. 18, 2012

(65) Prior Publication Data

US 2014/0077815 A1    Mar. 20, 2014

(51) Int. Cl.
  *G01N 27/416*   (2006.01)
  *G01R 31/36*   (2006.01)
  *H02J 7/00*   (2006.01)
  *G01R 19/00*   (2006.01)
  *G01R 21/06*   (2006.01)
  *G01R 19/165*   (2006.01)

(52) U.S. Cl.
  CPC ........ *G01R 31/3606* (2013.01); *G01R 19/0069* (2013.01); *G01R 31/361* (2013.01); *G01R 31/3648* (2013.01); *G01R 31/3651* (2013.01); *G01R 19/165* (2013.01); *G01R 21/06* (2013.01); *Y02E 60/122* (2013.01)

(58) Field of Classification Search
  CPC ........... G01R 31/3606; G01R 31/3648; G01R 19/165; G01R 19/0069; G01R 21/06; Y02E 60/122
  USPC .............. 324/427, 432, 434; 320/132; 702/63
  See application file for complete search history.

(56) References Cited

U.S. PATENT DOCUMENTS

| | | | | |
|---|---|---|---|---|
| 5,307,000 | A * | 4/1994 | Podrazhansky et al. ....... | 320/129 |
| 5,404,106 | A * | 4/1995 | Matsuda ........................ | 324/431 |
| 5,872,453 | A * | 2/1999 | Shimoyama et al. .......... | 324/431 |
| 6,522,102 | B1 * | 2/2003 | Cheiky et al. ................. | 320/125 |
| 7,498,772 | B2 * | 3/2009 | Palladino ....................... | 320/132 |
| 2004/0157113 | A1 * | 8/2004 | Klang .............................. | 429/50 |
| 2009/0256528 | A1 * | 10/2009 | Greening et al. ............. | 320/162 |
| 2009/0326842 | A1 * | 12/2009 | Thomas-Alyea ............... | 702/64 |
| 2010/0036626 | A1 * | 2/2010 | Kang et al. ...................... | 702/63 |
| 2010/0289454 | A1 * | 11/2010 | Akabori et al. ................ | 320/132 |
| 2011/0161025 | A1 * | 6/2011 | Tomura et al. ................... | 702/63 |
| 2011/0279094 | A1 * | 11/2011 | Nakatsuji et al. ............. | 320/162 |

* cited by examiner

*Primary Examiner* — M'Baye Diao
(74) *Attorney, Agent, or Firm* — Park, Vaughan, Fleming & Dowler LLP

(57) ABSTRACT

Some embodiments of the present invention provide a system that accurately and reliably updates a full charge capacity of a battery. During operation, the system charges the battery from an initial state to a rest point prior to reaching a fully charged state. The system then interrupts the charging process to allow the battery to relax to a resting voltage. Next, the system measures the resting voltage. The system then resumes the charging process toward the fully charged state. The system subsequently estimates the capacity of the battery based on the measured resting voltage and one or more other parameters.

43 Claims, 8 Drawing Sheets

METHOD AND APPARATUS FOR DETERMINING A CAPACITY OF A BATTERY

BACKGROUND

1. Field

The present invention generally relates to techniques for charging a rechargeable battery. More specifically, the present invention relates to a method and apparatus for updating the full charge capacity of a rechargeable battery during a charging process for the battery.

2. Related Art

Rechargeable lithium-ion batteries are presently used to provide power in a wide variety of systems, including smartphones, wireless devices, laptop computers, cordless power tools and electric vehicles. The full charge capacity of a battery (often referred to as "$Q_{max}$") is a measurement of the maximum chemical capacity of a rechargeable battery. As battery cells age, the full charge capacity of the battery generally decreases. Hence, measuring and updating the full charge capacity is fundamental to basic battery management, such as determining state-of-charge, reserve, use time and battery health.

To accurately estimate the full charge capacity of a battery after it has aged, existing techniques rely on an assumption that a user discharges the battery from a high state of charge to a low state of charge, with long rest periods at both endpoints of the discharging process, which allows two relaxed-voltage measurements to be taken at the two endpoints. Unfortunately, these existing techniques often fail to update the full charge capacity of a battery as a result of actual user behavior.

In reality, users typically leave their systems plugged in for a while after the systems have been fully charged, which allows an accurate relaxed measurement to be obtained at the full state of charge. However, it has been observed in the field that users do not typically allow rests at low states of charge. On the contrary, as soon as the battery discharges down to a low state of charge, the user typically plugs in the battery and charges it up again. Consequently, the battery does not rest and relax to the point where a measurement can be obtained at the low state of charge. This user behavior results in infrequent or even a complete absence of updates of the full charge capacity of a battery. This deficiency, in turn, can cause inaccurate reserve calculations and inaccurate gauging of a battery's state of charge which can lead to data loss from system brown-outs.

Note that problems that arise from the absence of updates to the full charge capacity can become worse for mobile phones because, even when the phones are not actively used, they are often configured to run applications in the background. As a result, some users almost never get full charge capacity updates because the batteries are not allowed to rest at the low states of charge. This means that over the lifetime of a mobile phone, while the capacity of the battery has become significantly smaller, the device might not be able to measure this accurately and will show an inaccurate state-of-charge to the user.

Hence, what is needed is a method and an apparatus for accurately and reliably updating a full charge capacity of a battery without the above-described problems.

SUMMARY

The described embodiments provide a system that accurately and reliably updates a full charge capacity of a battery. During operation, the system charges the battery from an initial state to a rest point prior to reaching a fully charged state. The system then interrupts the charging process to allow the battery to relax to a resting voltage. Next, the system measures the resting voltage. The system then resumes the charging process toward the fully charged state. The system subsequently estimates the capacity of the battery based on the measured resting voltage and one or more other parameters.

In some embodiments, prior to charging the battery, the system determines if a state of charge of the battery corresponding to the initial state is above a state of charge of the battery corresponding to the rest point. If so, the system charges the battery from the initial state to the fully charged state without interrupting the charging process.

In some embodiments, the system charges the battery with a constant current during a time period immediately preceding the rest point.

In some embodiments, the system interrupts the charging process by immediately dropping the charging current to zero.

In some embodiments, the system interrupts the charging process by reducing the charging current to a low level above zero.

In some embodiments, after reaching the fully charged state, the system allows the battery to relax to a second resting voltage and then measures the second resting voltage corresponding to the fully charged state.

In some embodiments, the system determines the capacity of the battery by computing a first state of charge of the battery corresponding to the resting voltage. The system also computes a second state of charge of the battery corresponding to the second resting voltage. The system additionally determines a coulomb count between the rest point and the fully charged state. The system subsequently determines the capacity of the battery based on the first state of charge, the second state of charge, and the coulomb count.

In some embodiments, the system determines the coulomb count between the rest point and the fully charged state by initiating a coulomb counting from the rest point after resuming the charging process. The system then concludes the coulomb counting when the fully charged state is reached. The system can then determine the coulomb count based on the coulomb counting between the rest point and the fully charged state.

In some embodiments, each of the resting voltage and the second resting voltage is an open circuit voltage (OCV).

In some embodiments, prior to charging the battery, the system selects the rest point based at least on one or more of the following parameters: a time required for the battery to relax at the rest point; an error associated with coulomb counting between the rest point and the fully charged state; a likelihood of a user discharging the battery below the rest point; and an open-circuit-voltage measurement accuracy required to compute a state of charge associated with the rest point.

In some embodiments, the system selects the rest point by ensuring that the time required for the battery to relax at the rest point is significantly shorter than a time to charge the battery from the initial state to the fully charged state without interruption.

In some embodiments, the rest point is at or above a 60% state of charge of the battery.

In some embodiments, the rest point is at or below an 80% state of charge of the battery.

One embodiment of the present invention provides a battery with a capacity estimation mechanism. This battery includes a current sensor to measure a current for the battery, and a voltage sensor to measure a voltage across terminals of the battery. The capacity estimation process is under the control of a controller, which receives inputs from the voltage sensor and the current sensor, and generates a capacity estimate. During the capacity estimation process, the controller (1) charges the battery from an initial state to a rest point prior to reaching a fully charged state; (2) interrupts the charging process to allow the battery to relax to a resting voltage; (3) measures the resting voltage; (4) resumes the charging process toward the fully charged state; and (5) estimates the capacity of the battery based on the measured resting voltages and the coulomb count between the measurement points.

Some embodiments described in the present disclosure also provide a system that accurately evaluates a state of charge of a battery during a charging process. During operation, the system charges the battery from an initial state to a rest point prior to reaching a fully charged state. The system then interrupts the charging process to allow the battery to relax to a resting voltage. Next, the system measures the resting voltage. The system subsequently determines a state of charge of the battery at the rest point based on the measured resting voltage.

DETAILED DESCRIPTION

Figure 1:
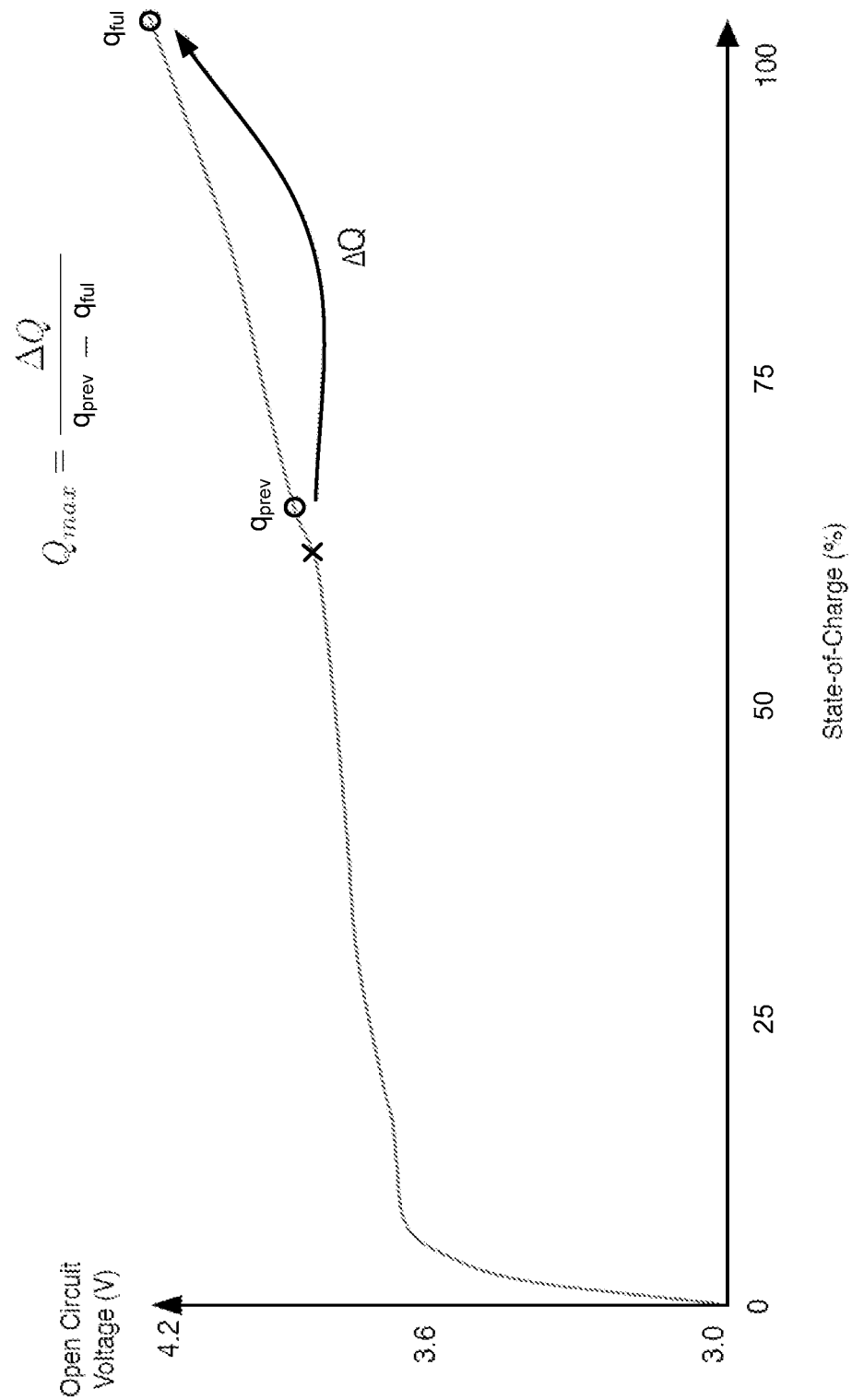
FIG. 1 illustrates a coulomb counting based $Q_{max}$ measurement technique for a battery in accordance with some embodiments herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

TERMINOLOGY

Throughout the specification, the following terms have the meanings provided herein, unless the context clearly dictates otherwise. The term "battery" generally means a rechargeable battery which includes a cell pack (with one or more cells). Hence, a term such as "full charge capacity of a battery" means "full charge capacity of the cell pack within the battery;" "charging a battery" means "charging the cell pack within the battery;" and "allowing the battery to relax" means "allowing the cell pack within the battery to relax." Furthermore, terms "rested" and "relaxed" are used interchangeably to refer to a state of a battery wherein the current in the battery is sufficiently small (including near-zero currents) so that dynamic effects are negligible to allow OCV measurements to be taken within a desired accuracy. Thus, terms "rested OCV measurement" and "relaxed OCV measurement" within this disclosure are used interchangeably to mean an OCV measurement performed at the aforementioned "rested" or "relaxed" state of the battery. In the discussion below, the term "OCV measurement" generally refers to the aforementioned "rested/relaxed OCV measurement," unless the context clearly dictates otherwise. Moreover, the term "resting voltage" throughout this disclosure refers to the voltage associated with the "rested/relaxed OCV measurement," unless the context clearly dictates otherwise.

Overview

The present disclosure provides a technique for accurately and reliably updating the full charge capacity (also referred to as "$Q_{max}$" below) of a battery. The aforementioned problem with infrequent updates of the full charge capacity commonly results from users not letting their systems relax at low states of charge. The proposed solution to this problem involves modifying the charging process by inserting a rest point during charging, thereby allowing a rested OCV measurement to be performed. Note that battery cells can relax at very different rates at different states of charge. To minimize the impact on the user from the rest point measurement, the rest point can be carefully chosen to be at a state of charge when the cells comparatively quickly reach a steady state where a measurement can be acquired. To further shorten the rest time needed, the charging current to the rest point may be controlled at a fixed level. This ensures that there is little or no dynamic behavior during the cell relaxation, thereby allowing the open circuit voltage measurement to be accelerated by extrapolating quickly to the resting voltage. This controlled charging process is described in more detail below.

Coulomb Counting Based $Q_{max}$ Measurement

FIG. 1 illustrates a coulomb counting based $Q_{max}$ measurement technique for a battery in accordance with some embodiments herein. As illustrated in FIG. 1, two rest measurements are performed on the battery. The first rest measurement measures a first open circuit voltage (OCV) value of the battery corresponding to an intermediate-level state-of-charge (SOC) "$q_{prev}$," wherein $q_{prev}$ can be derived from the first OCV value based on a predetermined OCV vs. SOC relationship which has been calibrated for the battery. For example, the OCV vs. SOC relationship shown in FIG. 1 can be used. In the example shown, $q_{prev}$ is between 50% and 75% SOC. In an ideal case, the first rest measurement occurs when the battery is allowed to relax (i.e., unplugged and unused) for a sufficiently long period of time until that the first OCV value can be reliably measured.

Also shown in FIG. 1, the second rest measurement measures a second OCV value of the battery at a full or near full SOC "$q_{ful}$," wherein $q_{ful}$ can be derived from the second OCV value based on the predetermined OCV-SOC relationship. In the example shown, $q_{prev}$ is at 100% SOC. Typically, the second rest measurement occurs when the battery reaches the full SOC and the system remains plugged in for a sufficiently long period of time until the second OCV value can be reliably measured.

Separately, a coulomb counting is performed during a charging process from the lower SOC "$q_{prev}$" to the full SOC "$q_{ful}$" to determine the amount of charge flow $\Delta Q$ during charging. Note that the system can use any current-sensing-based coulomb counting techniques to obtain $\Delta Q$. In one embodiment, the $\Delta Q$ measurement takes place between the two rest measurements. In some embodiments, the system measures $\Delta Q$ prior to or after both $q_{prev}$ and $q_{ful}$ have been determined. Finally, the system determines the full charge capacity $Q_{max}$ for the battery based on $q_{prev}$, $q_{ful}$, and $\Delta Q$. In one embodiment, $Q_{max}$ is computed by:

$$Q_{max} = \frac{\Delta Q}{q_{ful} - q_{prev}}.$$

In practice, a user rarely rests long enough at low states of charge to allow $q_{prev}$ and $\Delta Q$ to be measured. As a result, the conventional $Q_{max}$ updates based on the above-described approach take place very infrequently. This problem gets even worse on devices with background services that constantly disturb resting, thus preventing the battery from reaching a relaxed state.

A Modified Charging Operation with Inserted Rest Points

Figure 2:
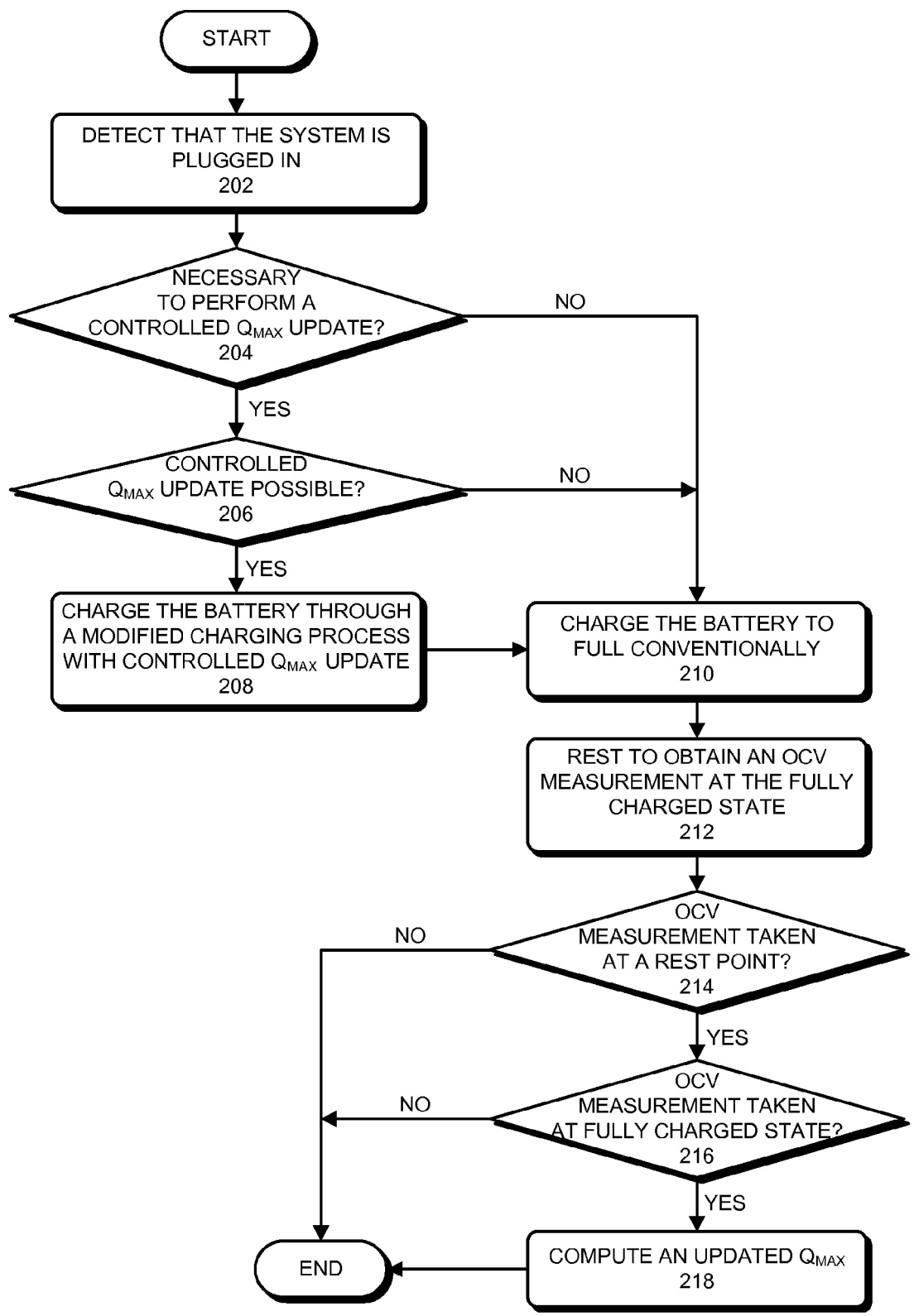
FIG. 2 presents a flowchart illustrating a process of charging a battery that includes a controlled $Q_{max}$ update in accordance with some embodiments herein.

Conventional charging of a battery does not include controlled interruptions in the course of the charging process until the battery is unplugged from the charging source. Proposed embodiments modify the conventional charging process by inserting at least one rest point during the charging process which temporarily interrupts the charging current to allow the battery to relax, thereby allowing a rested OCV measurement to be performed during the interruption of the charging process. In one embodiment, the at least one rest point is associated with a predetermined state of charge. We refer to this modified charging process which includes at least one inserted rest point prior to reaching a fully charged state as a "controlled $Q_{max}$ update." FIG. 2 presents a flowchart illustrating a process of charging a battery that includes a controlled $Q_{max}$ update in accordance with some embodiments herein.

Typically, the process starts when the system detects that the system is plugged in, for example, when the user plugs in the system to a charger or a power source (step 202). Note that the system described herein may include a battery management unit (BMU). The system then determines if it is necessary to perform a controlled $Q_{max}$ update (step 204). In one embodiment, the system determines if it is necessary to perform a controlled $Q_{max}$ update based on a predicted uncertainty associated with $Q_{max}$. More specifically, the system compares the uncertainty of the most recently updated $Q_{max}$ with a threshold uncertainty. In this case, the system triggers a controlled $Q_{max}$ update if the $Q_{max}$ uncertainty exceeds the threshold uncertainty. On the other hand, the system bypasses the controlled $Q_{max}$ update if the $Q_{max}$ uncertainty is below the threshold uncertainty. Note that $Q_{max}$ uncertainty generally increases with time. Hence, the system can determine if a controlled $Q_{max}$ update is necessary based on how much time has elapsed since the last $Q_{max}$ update has taken place. In one embodiment, the system triggers a controlled $Q_{max}$ update when a predetermined time period (e.g., one month) since the last $Q_{max}$ update has been reached.

If it is determined that performing a controlled $Q_{max}$ update is not necessary, the system proceeds to conventionally charging the battery to full, without stopping at a rest point during the charging process (step 210). However, if it is determined that performing a controlled $Q_{max}$ update is necessary, the system additionally determines if performing a controlled $Q_{max}$ update is possible (step 206). In some embodiments, performing step 204 is optional and the system directly proceeds to step 206 from step 202.

In one embodiment, determining if performing a controlled $Q_{max}$ update is possible involves determining if the initial state of charge of the battery is below the state of charge of the battery associated with a predetermined rest point (also referred to as the "target state of charge" below). Note that one requirement of a controlled $Q_{max}$ update is that the system stops at the predetermined rest point corresponding to a higher state of charge (relative to the initial state of charge) during the charging process. Consequently, one prerequisite associated with the controlled $Q_{max}$ update is that the battery has discharged to a state of charge below the target state of charge. For example, if the initial state of charge is 50% whereas the target state of charge is 60%, the controlled $Q_{max}$ update is deemed possible. On the other hand, if the system determines that the initial state of charge of the battery is above the target state of charge, the controlled $Q_{max}$ update is deemed not possible.

If a controlled $Q_{max}$ update is deemed not possible at step 206, the system proceeds to step 210 to conventionally charge the battery to full, without performing the controlled $Q_{max}$ update. On the other hand, if a controlled $Q_{max}$ update is deemed possible at step 206, the system proceeds to charge the battery through a modified charging process with the controlled $Q_{max}$ update (by inserting a rest point) (step 208). Note that the controlled $Q_{max}$ update typically includes the steps of controlled charging to a predetermined rest point (e.g., a predetermined cell voltage), relaxing at the rest point, and performing a rest measurement at the rest point. A detailed embodiment of the controlled $Q_{max}$ update is described in conjunction with FIG. 3. After taking the rest measurement at the rest point, the system proceeds to step 210 to conventionally charge the battery to full.

After the system conventionally charges the battery to full and a sufficient rest period has been reached (e.g., when the system remains plugged in for a while), the system obtains an OCV measurement at the fully charged state of the battery (step 212). Note that step 212 may fail to obtain an OCV measurement if the rest period is too short to allow the rest measurement to take place. For example, the user may unplug the external power and start using the battery right away.

Next, the system determines if an OCV measurement at a rest point has been taken during the charging process (step 214). As mentioned above, the system can reach step 214 without going through the controlled $Q_{max}$ update (step 208) which obtains the OCV measurement at the rest point. If it is determined that the OCV measurement has been taken at the rest point, the system additionally determines if an OCV measurement at the fully charged state has been taken (step 216). If so, the system proceeds to compute an updated $Q_{max}$ using a coulomb counting based $Q_{max}$ update technique or other $Q_{max}$ update techniques (step 218). In this case, the system obtains an updated $Q_{max}$ through the controlled $Q_{max}$ update. However, if either the OCV measurement at the rest point or the OCV measurement at the fully charged state does not occur, the charging process completes without a $Q_{max}$ update.

Note that the above-described $Q_{max}$ update process assumes that the first rest measurement for the $Q_{max}$ update is taken at the rest point and the second rest measurement is taken at the fully charged state. In a variation to this embodiment, the system inserts two predetermined rest points during the charging process between the initial state of charge and the full state of charge, and obtains a relaxed OCV measurement at each of the two rest points. In this embodiment, if the relaxed OCV measurement at the fully charged state fails to occur, the system can use both relaxed OCV measurements from the two rest points to compute the updated $Q_{max}$. However, if the relaxed OCV measurement at the fully charged state is also taken, the system can choose one of the two OCV measurements from the two rest points and the OCV measurement at the fully charged state to compute the updated $Q_{max}$.

Figure 3:
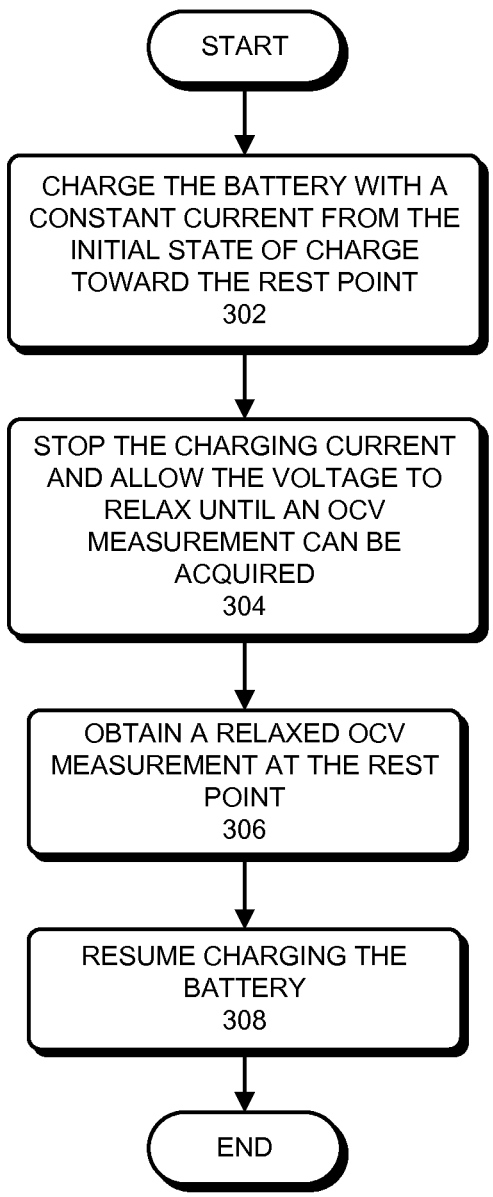
FIG. 3 presents a flowchart illustrating a modified charging process which uses an inserted rest point for a controlled $Q_{max}$ update in accordance with some embodiments herein.

FIG. 3 presents a flowchart illustrating a modified charging process which uses an inserted rest point for a controlled $Q_{max}$ update in accordance with some embodiments herein. Note that FIG. 3 provides a detailed description of step 208 in FIG. 2. The embodiment assumes that a rest point is predetermined prior to the charging process. A more detailed process for determining the rest point is provided below. In one embodiment, the rest point corresponds to a predetermined state of charge of the battery (i.e., the "target state of charge").

Figure 4:
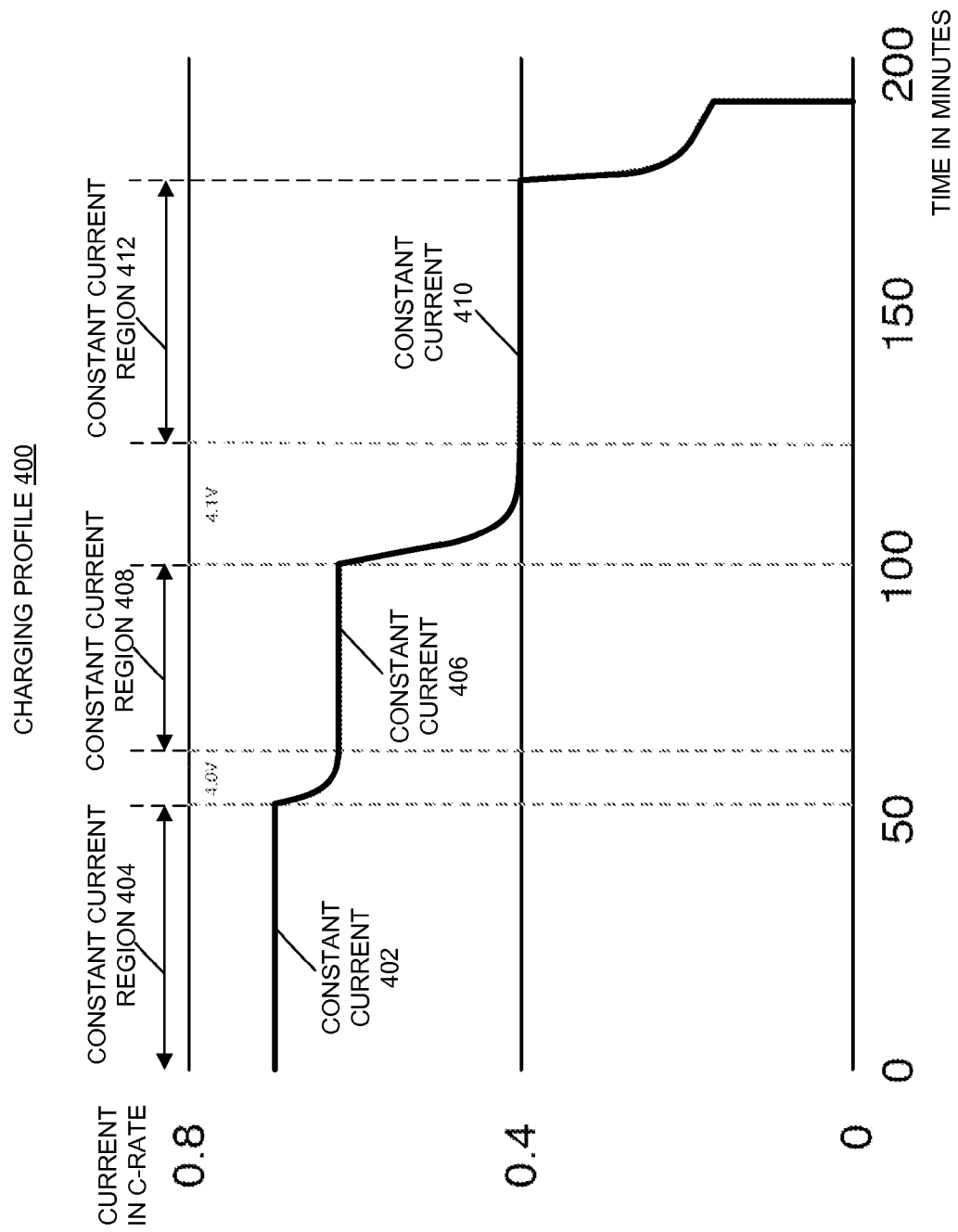
FIG. 4 illustrates a charging profile that employs a constant-current constant-voltage charging profile in accordance with some embodiments herein.

The process typically starts by conventionally charging the battery with a constant current from the initial state of charge toward the rest point associated with the target state of charge (step 302). During this process, the system constantly evaluates and compares the current state of charge with the target state of charge of the rest point. Note that between the initial state of charge and the target state of charge, the system can use more than one level of constant charging current. For example, FIG. 4 illustrates a charging profile 400 that employs a constant-current constant-voltage charging profile in accordance with some embodiments herein. More specifically, the system first applies a first constant current 402 to the battery in the first constant current region 404 until a first target voltage is reached (e.g., at 4.0V). Next, the system applies the first constant voltage to the battery until the charging current reduces to a second constant current 406. The system then applies the second constant current 406 to the battery in the second constant current region 408 until a second target voltage is reached (e.g., at 4.1V). The system then applies the second constant voltage to the battery until the charging current reduces to a third constant current 410. Next, the system applies the third constant current 410 to the battery in the third constant current region 412 until a third target voltage is reached. The system then applies the third constant voltage to the battery until the full state of charge is reached, and the charging is completed. Note that the embodiment shown does not include a rest point for the controlled $Q_{max}$ update.

Referring back to FIG. 3, when the target state of charge, i.e., rest point is reached, the system interrupts the charging process by immediately stopping the charging current and allowing the voltage to relax until an OCV measurement can be acquired (step 304). In some embodiments, instead of immediately dropping the charging current to zero and then resting, the system first reduces the charging current to a significantly low level above zero. This process may take a short period of time, e.g., a few minutes. The system then starts resting the battery by stopping the remaining charging current.

After the battery has sufficiently relaxed, the system obtains a relaxed OCV measurement at the rest point, thereby obtaining the rest measurement at the target state of charge (step 306). Next, the system resumes charging the battery (step 308) and conventionally charging the battery to the full state of charge (i.e., continuing to step 210 in FIG. 2 of the overall charging process). Note that, if more than one rest point is inserted during the controlled $Q_{max}$ update, the system simply repeats steps 302-308 each time a new rest point is reached.

Figure 5:
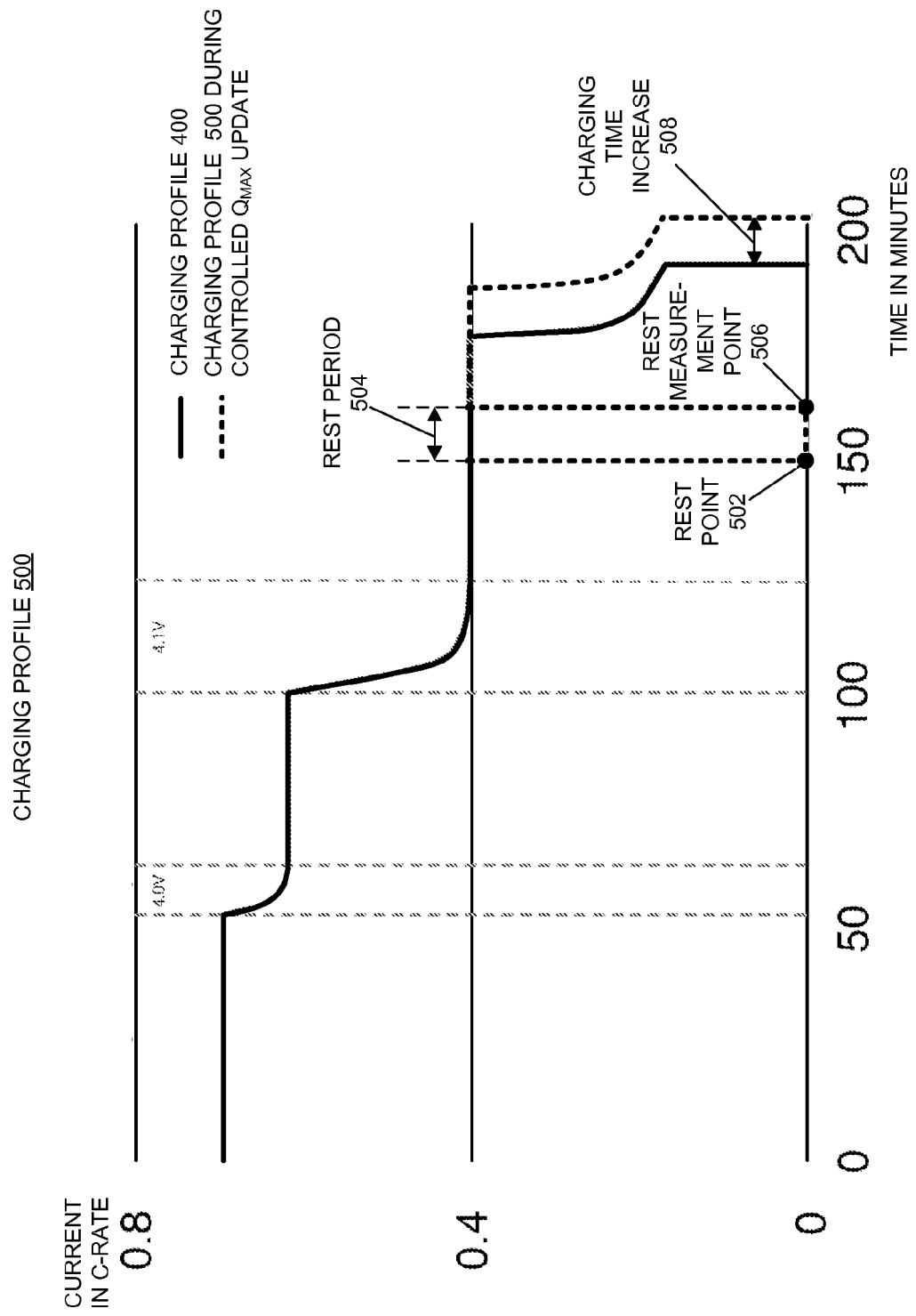
FIG. 5 illustrates a charging profile of a controlled $Q_{max}$ update that includes a single rest point in accordance with some embodiments herein.

FIG. 5 illustrates a charging profile 500 of a controlled $Q_{max}$ update that includes a single rest point in accordance with some embodiments herein. Note that the charging profile 500 with the controlled $Q_{max}$ update illustrated in FIG. 5 is a variation of charging profile 400 of FIG. 4, which is also shown in FIG. 5 for comparison. More specifically, charging profile 500 with the controlled $Q_{max}$ update follows the original charging profile 400 (shown in solid lines) initially. After a predetermined rest point at a time mark 502 (near the 150-minute mark), charging profile 500 enters the controlled $Q_{max}$ update phase which is shown in dotted lines. As is illustrated in FIG. 5, the system associated with charging profile 500 drops the charging current from the third constant current at 0.4 C-rate to zero. The system then waits for the battery to rest during a rest period marked as 504. Next, the system takes the rest measurement at time mark 506. The system then resumes the charging process by restoring to the third constant current and continues to charge the battery to full. Note that the overall charging time increase 508 from the original charging profile 400 as a result of the controlled $Q_{max}$ update is substantially the same as the rest period 504.

Note that, while more than one level of charging current may be used to charge up toward the target state of charge, it is desirable to have a constant charging current during a time period immediately preceding the rest point. This ensures that there is little or no dynamic behavior during the cell relaxation, thereby allowing the open circuit voltage measurement be accelerated by extrapolating quickly to the resting voltage.

Note that the controlled $Q_{max}$ update profile is substantially similar to the original charging profile of FIG. 4 except for additional rest period 504 occurring between rest point 502 and rest measurement point 506. When the rest point is chosen properly, the charging time increase such as time 508 is insignificant and will not degrade the user experience. However, if the rest point is chosen improperly, the charging time increase due to the rest measurement may be significant compared with the regular charging time and can negatively affect the user experience.

Choosing Rest Points

As mentioned above, the rest point associated with the controlled $Q_{max}$ update can be predetermined prior to the charging process. When choosing a rest point for the controlled $Q_{max}$ update, a number of interrelated considerations are to be balanced. These considerations can include, but are not limited to, the time required for the battery to relax at the rest point; the uncertainty associated with coulomb count $\Delta Q$ from the rest point to the full charge capacity; the likelihood of the user discharging below the rest point; and the voltage and curve accuracy required to establish the state of charge at a given rest point.

Figure 6:
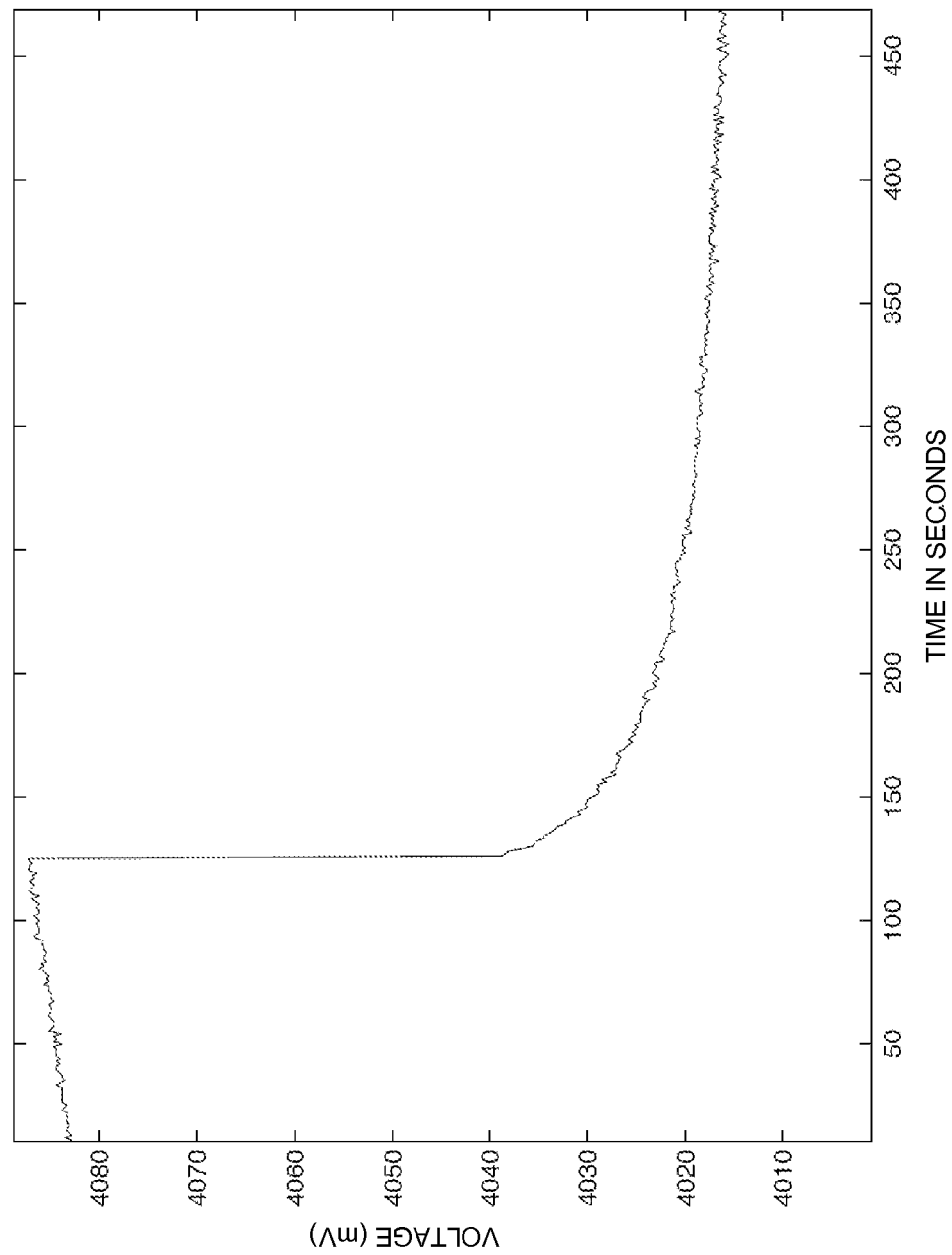
FIG. 6 illustrates an exemplary cell relaxing profile after a constant current charging process has been applied up to a rest point at a high SOC in accordance with some embodiments herein.

Among the above considerations, the time required for the battery to relax is one of the more important considerations because this time accounts for an increased charging time for the system, which can negatively impact the user experience. Hence, a rest point associated with a fast time to relax is preferred. The time needed for a cell to relax is state-of-charge dependent and needs to be characterized on a per cell-chemistry basis. For example, at 60% SOC it can take one hour to relax, but at 80% SOC it may take only minutes to relax. FIG. 6 illustrates an exemplary cell relaxing profile 600 after a constant current charging process has been applied up to a rest point at a high SOC in accordance with some embodiments herein. The data shows that the time to relax, or the additional charging time, can be kept to a few minutes, depending on how large an error in full charge capacity can be tolerated. If a rest point is chosen based on this profile, it is reasonable to rest for somewhere between three or four minutes to get an accurate open circuit voltage measurement. While charging a battery to full capacity usually takes on the order of hours, the additional minutes of charging time are probably insignificant to the user experience.

While it is desirable to choose the rest point at a higher SOC based on the fast-to-relax consideration, a rest point at a very high SOC can cause a decrease in accuracy in determining the $Q_{max}$. In the above-described coulomb counting technique, $Q_{max}$ is determined by taking the difference between the two open circuit voltage measurements and dividing by the coulomb count $\Delta Q$, which itself is determined during the charging process between the two rest measurements. Because the coulomb count has an error associated with it, if the SOC at the rest point is too high, the measured $\Delta Q$ is small and the uncertainty in the measurement increases. This uncertainty in $\Delta Q$ is then propagated to the uncertainty in $Q_{max}$. For this consideration alone, a lower SOC is desirable for the measurement accuracy, but it could be in conflict with the fast-to-relax consideration. When balancing the two considerations, the rest point should be placed above a given low state of charge and below a given high state of charge. In one embodiment, the rest point is between 60% and 80% SOC to balance these two considerations. Below 60% SOC, relaxation times are significantly increased, whereas above 80% SOC, the error from the coulomb count measurement starts to get noticeable.

Note that, in order for the controlled $Q_{max}$ update to occur, the user has to discharge below the predetermined rest point. In systems with a very large capacity battery, such as the iPad, discharging below a high SOC rest point can take a significant amount of time. Hence, the likelihood of the user discharging below a given SOC associated with a potential rest point has to be balanced against the time required for the battery to relax.

Another factor which needs to be taken into account in determining the rest point is related to the OCV measurement voltage and curve accuracy required to establish state of charge at a given rest point. Referring to FIG. 1, note that the OCV-SOC curve includes linear regions and non-linear regions. If the rest point is chosen right between two relatively linear regions shown as "X", the SOC accuracy is likely to suffer. However, if the rest point is chosen at the $q_{prev}$ in the relatively linear region, the SOC accuracy may be improved.

Figure 7:
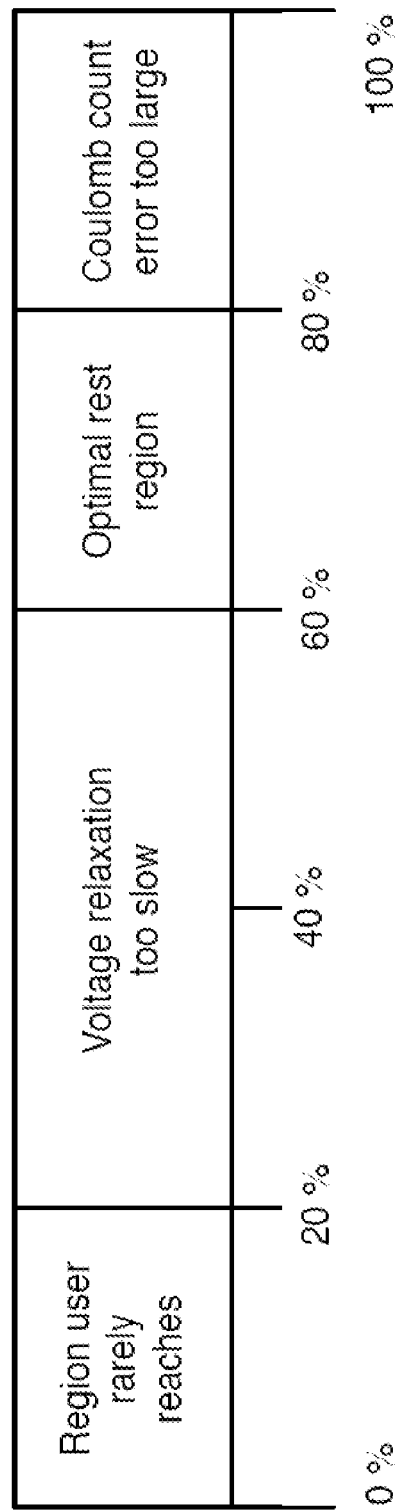
FIG. 7 provides a chart illustrating different state of charge regions which may be used to guide the choice of a proper rest point.

In addition to the above considerations, other factors, such as temperature and charging/discharging history of the system may be taken into account and balanced with all other considerations in determining a proper rest point. FIG. 7 provides a chart illustrating different state of charge regions which may be used to guide the choice of a proper rest point. Note that the chart shows that the optimal rest point region is approximately between 60% and 80% SOC.

Battery Design

Figure 8:
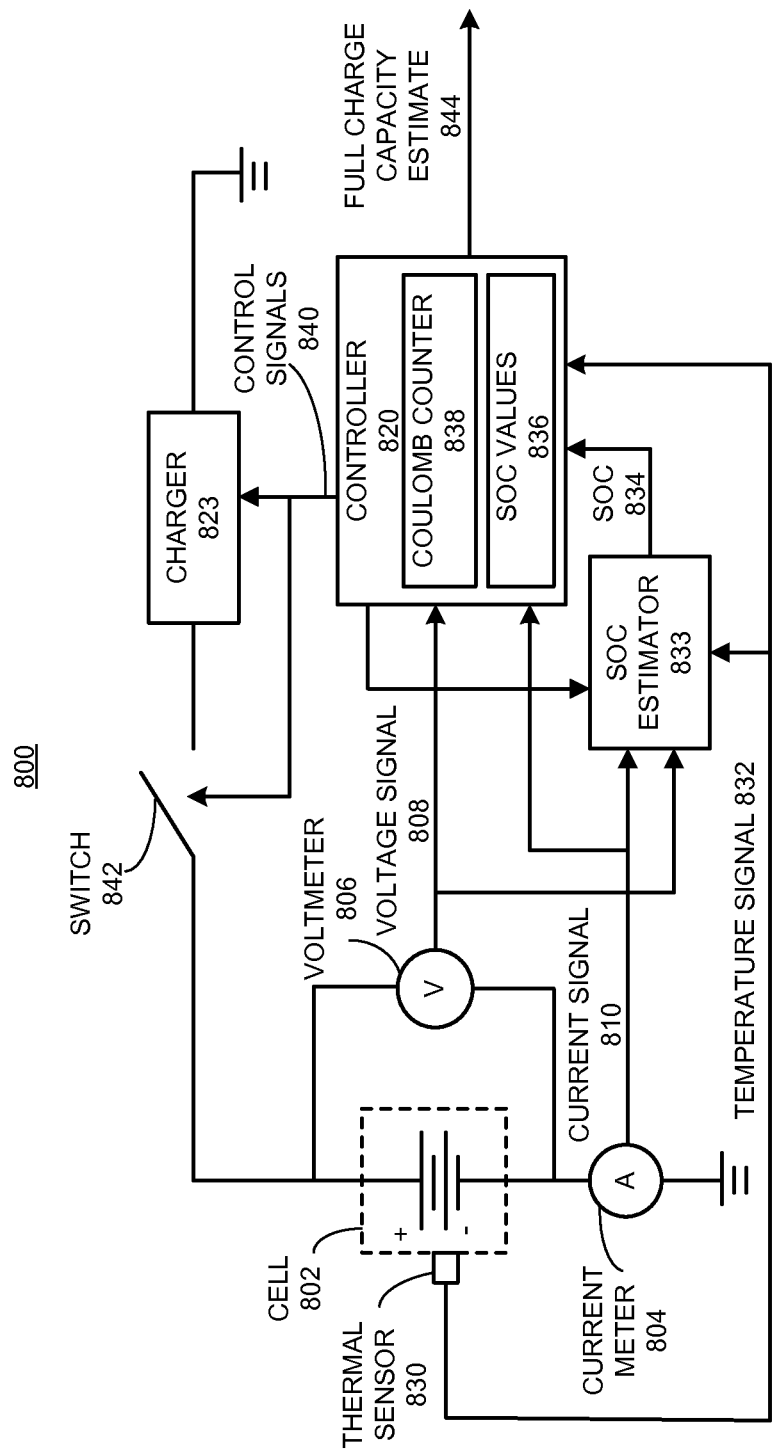
FIG. 8 illustrates a rechargeable battery that supports a controlled $Q_{max}$ update during charging in accordance with some embodiments herein.

FIG. 8 illustrates a rechargeable battery 800 that supports a controlled $Q_{max}$ update during charging in accordance with some embodiments herein. Battery 800 includes a battery cell 802. It also includes a current meter (current sensor) 804, which measures a charging current through cell 802, and a voltmeter (voltage sensor) 806, which measures a voltage across cell 802. Battery 800 also includes a thermal sensor 830, which measures the temperature of battery cell 802. (Note that numerous possible designs for current meters, voltmeters and thermal sensors are well-known in the art.)

Rechargeable battery 800 is coupled to a charger 823. Note that, although charger 823 is illustrated in FIG. 8, charger 823 is typically not part of rechargeable battery 800. However, charger 823 is associated with the charging process by providing charging current to cell 802. Note that charger 823 can include any battery charging mechanism now known or later developed. This includes, but is not limited to, a USB charger, a multi-pin charger, a docking station, a portable charger, and a wall charger.

The above-described modified charging process with a controlled $Q_{max}$ update is controlled by a controller 820, which receives: a voltage signal 808 from voltmeter 806, a current signal 810 from current meter 804, a temperature signal 832 from thermal sensor 830, and a state of charge (SOC) value 834 from SOC estimator 833. Additionally, controller 820 stores one or more predetermined state of charge values 836. These state of charge values are used to generate one or more rest points during the controlled $Q_{max}$ update. Controller 820 can include a coulomb counter 838 for estimating the amount of charge flow $\Delta Q$ based on current 810 during a charging process. Controller 820 can also generate control signals 840 for controlling a charging current of charger 823. Control signals 840 can also control a switch 842. In some embodiments, control signals 840 can be used to turn off switch 842 to decouple charger 823 from cell 802.

During a charging operation, controller 820 controls SOC estimator 833 to determine two SOC values corresponding to the two relaxed OCV measurements at a rest point and at the full charge. SOC estimator 833 receives a voltage 808 from voltmeter 806, a current 810 from current meter 804 and a temperature 832 from thermal sensor 830, and outputs a state of charge value 834. Controller 820 outputs a full charge capacity estimate 844 of cell 802 based on two SOC values corresponding to the two relaxed OCV measurements and an estimated coulomb count between the two relaxed OCV measurements.

Note that controller 820 can be implemented using either a combination of hardware and software or purely hardware. In one embodiment, controller 820 is implemented using a microcontroller, which includes a microprocessor that executes instructions which control the full charge capacity update process.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for accurately estimating a capacity of a battery, comprising:
    determining if a state of charge of the battery corresponding to an initial state is above a state of charge of the battery corresponding to a rest point; and
    if so, charging the battery from the initial state to a fully charged state without interrupting the charging process;
    if the state of charge of the battery corresponding to the initial state is below the state of charge of the battery corresponding to the rest point, charging the battery from the initial state to the rest point prior to reaching the fully charged state;
    interrupting the charging process to allow the battery to relax to a resting voltage;
    measuring the resting voltage;
    resuming the charging process toward the fully charged state; and
    estimating the capacity of the battery based at least on the resting voltage.

2. The method of claim 1, wherein the capacity is a full charge capacity.

3. The method of claim 1, wherein charging the battery from the initial state to the rest point involves charging the battery with a constant current during a time period immediately preceding the rest point.

4. The method of claim 3, wherein interrupting the charging process involves immediately dropping the charging current to zero.

5. The method of claim 3, wherein interrupting the charging process involves reducing the charging current to a low level above zero.

6. The method of claim 1, wherein after reaching the fully charged state, the method further comprises:
    allowing the battery to relax to a second resting voltage; and
    measuring the second resting voltage corresponding to the fully charged state.

7. The method of claim 6, wherein estimating the capacity of the battery based at least on the resting voltage involves:
    computing a first state of charge of the battery corresponding to the resting voltage;
    computing a second state of charge of the battery corresponding to the second resting voltage;
    determining a coulomb count between the rest point and the fully charged state; and
    determining the capacity of the battery based on the first state of charge, the second state of charge, and the coulomb count.

8. The method of claim 7, wherein determining the coulomb count between the rest point and the fully charged state involves:
    initiating a coulomb counting from the rest point after resuming the charging process;
    concluding the coulomb counting when the fully charged state is reached; and
    determining the coulomb count based on the coulomb counting between the rest point and the fully charged state.

9. The method of claim 7, wherein each of the resting voltage and the second resting voltage is an open circuit voltage (OCV).

10. The method of claim 1, wherein prior to charging the battery, the method further comprises selecting the rest point based at least on one or more of the following parameters:
    a time required for the battery to relax at the rest point;
    an error associated with a coulomb counting between the rest point and the fully charged state;
    a likelihood of a user discharging the battery below the rest point; and
    an open-circuit-voltage measurement accuracy required to compute a state of charge associated with the rest point.

11. The method of claim 10, wherein selecting the rest point involves ensuring that the time required for the battery to relax at the rest point is significantly shorter than a time to charge the battery from the initial state to the fully charged state without interruption.

12. The method of claim 10, wherein the rest point is in the vicinity of or above a 60% state of charge of the battery.

13. The method of claim 10, wherein the rest point is in the vicinity of or below an 80% state of charge of the battery.

14. A non-transitory computer-readable storage medium storing instructions that when executed by a controller for a battery cause the controller to perform a method for accurately estimating a capacity of the battery, the method comprising:
    determining if a state of charge of the battery corresponding to an initial state is above a state of charge of the battery corresponding to a rest point; and
    if so, charging the battery from the initial state to a fully charged state without interrupting the charging process;
    if the state of charge of the battery corresponding to the initial state is below the state of charge of the battery corresponding to the rest point, charging the battery from the initial state to the rest point prior to reaching the fully charged state;
    interrupting the charging process to allow the battery to relax to a resting voltage;
    measuring the resting voltage;
    resuming the charging process toward the fully charged state; and
    estimating the capacity of the battery based at least on the resting voltage.

15. The non-transitory computer-readable storage medium of claim 14, wherein the capacity is a full charge capacity.

16. The non-transitory computer-readable storage medium of claim 14, wherein charging the battery from the initial state to the rest point involves charging the battery with a constant current during a time period immediately preceding the rest point.

17. The non-transitory computer-readable storage medium of claim 16, wherein interrupting the charging process involves immediately dropping the charging current to zero.

18. The non-transitory computer-readable storage medium of claim 14, wherein after reaching the fully charged state, the method further comprises:
    allowing the battery to relax to a second resting voltage; and
    measuring the second resting voltage corresponding to the fully charged state.

19. The non-transitory computer-readable storage medium of claim 18, wherein determining the capacity of the battery based at least on the resting voltage involves:
    computing a first state of charge of the battery corresponding to the resting voltage;

computing a second state of charge of the battery corresponding to the second resting voltage;
determining a coulomb count between the rest point and the fully charged state; and
determining the capacity of the battery based on the first state of charge, the second state of charge, and the coulomb count.

20. The non-transitory computer-readable storage medium of claim 19, wherein determining the coulomb count between the rest point and the fully charged state involves:
initiating a coulomb counting from the rest point after resuming the charging process;
concluding the coulomb counting when the fully charged state is reached; and
determining the coulomb count based on the coulomb counting between the rest point and the fully charged state.

21. The non-transitory computer-readable storage medium of claim 14, wherein prior to charging the battery, the method further comprises selecting the rest point based at least on one or more of the following parameters:
a time required for the battery to relax at the rest point;
an error associated with a coulomb counting between the rest point and the fully charged state;
a likelihood of a user discharging the battery below the rest point; and
an open-circuit-voltage measurement accuracy required to compute a state of charge associated with the rest point.

22. The non-transitory computer-readable storage medium of claim 21, wherein selecting the rest point involves ensuring that the time required for the battery to relax at the rest point is significantly shorter than a time to charge the battery from the initial state to the fully charged state without interruption.

23. A battery with a capacity estimation mechanism, comprising:
a cell;
a voltage sensor configured to measure a voltage for the battery;
a current sensor configured to measure a current for the battery; and
a controller configured to receive inputs from the voltage sensor and the current sensor, and to generate a capacity estimate;
wherein the controller is configured to:
determine if a state of charge of the battery corresponding to an initial state is above a state of charge of the battery corresponding to a rest point; and
if so, charge the battery from the initial state to a fully charged state without interrupting the charging process;
if the state of charge of the battery corresponding to the initial state is below the state of charge of the battery corresponding to the rest point, charge the battery from the initial state to the rest point prior to reaching the fully charged state;
interrupt the charging process to allow the battery to relax to a resting voltage;
measure the resting voltage;
resume the charging process toward the fully charged state; and
estimate the capacity of the battery based at least on the resting voltage.

24. The battery of claim 23, wherein the controller is configured to charge the battery from the initial state to the rest point by charging the battery with a constant current during a time period immediately preceding the rest point.

25. The battery of claim 24, wherein the controller is configured to interrupt the charging process by immediately dropping the charging current to zero.

26. The battery of claim 23, wherein after reaching the fully charged state, the controller is configured to:
allow the battery to relax to a second resting voltage; and
measure the second resting voltage corresponding to the fully charged state.

27. The battery of claim 26, wherein the controller is configured to determine the capacity of the battery by:
computing a first state of charge of the battery corresponding to the resting voltage;
computing a second state of charge of the battery corresponding to the second resting voltage;
determining a coulomb count between the rest point and the fully charged state; and
determining the capacity of the battery based on the first state of charge, the second state of charge, and the coulomb count.

28. The battery of claim 27, wherein the controller is configured to determine the coulomb count between the rest point and the fully charged state by:
initiating a coulomb counting from the rest point after resuming the charging process;
concluding the coulomb counting when the fully charged state is reached; and
determining the coulomb count based on the coulomb counting between the rest point and the fully charged state.

29. A method for evaluating a state of charge of a battery during a charging process, the method comprising:
determining if a state of charge of the battery corresponding to an initial state is above a state of charge of the battery corresponding to a rest point; and
if so, charging the battery from the initial state to a fully charged state without interrupting the charging process;
if the state of charge of the battery corresponding to the initial state is below the state of charge of the battery corresponding to the rest point, charging the battery from the initial state to the rest point prior to reaching the fully charged state;
interrupting the charging process to allow the battery to relax to a resting voltage;
measuring the resting voltage; and
determining a state of charge of the battery at the rest point based at least on the resting voltage.

30. A method for accurately estimating a capacity of a battery, comprising:
charging the battery from an initial state to a rest point prior to reaching a fully charged state;
interrupting the charging process to allow the battery to relax to a resting voltage;
measuring the resting voltage;
resuming the charging process toward the fully charged state; and
estimating the capacity of the battery based at least on the resting voltage;
wherein prior to charging the battery, the method further comprises selecting the rest point based at least on one or more of the following parameters:
a time required for the battery to relax at the rest point;
an error associated with a coulomb counting between the rest point and the fully charged state;
a likelihood of a user discharging the battery below the rest point; and an open-circuit-voltage measurement accuracy required to compute a state of charge associated with the rest point.

31. The method of claim 30, wherein selecting the rest point involves ensuring that the time required for the battery to relax at the rest point is significantly shorter than a time to charge the battery from the initial state to the fully charged state without interruption.

32. The method of claim 30, wherein the rest point is in the vicinity of or above a 60% state of charge of the battery.

33. The method of claim 30, wherein the rest point is in the vicinity of or below an 80% state of charge of the battery.

34. A battery with a capacity estimation mechanism, comprising:
a cell;
a voltage sensor configured to measure a voltage for the battery;
a current sensor configured to measure a current for the battery; and
a controller configured to receive inputs from the voltage sensor and the current sensor, and to generate a capacity estimate;
wherein the controller is configured to:
charge the battery from an initial state to a rest point prior to reaching a fully charged state;
interrupt the charging process to allow the battery to relax to a resting voltage;
measure the resting voltage;
resume the charging process toward the fully charged state; and
estimate the capacity of the battery based at least on the resting voltage;
wherein prior to charging the battery, the controller is configured to select the rest point based at least on one or more of the following parameters:
a time required for the battery to relax at the rest point;
an error associated with a coulomb counting between the rest point and the fully charged state;
a likelihood of a user discharging the battery below the rest point; and
an open-circuit-voltage measurement accuracy required to compute a state of charge associated with the rest point.

35. The battery of claim 34, wherein while selecting the rest point, the controller is configured to ensure that the time required for the battery to relax at the rest point is significantly shorter than a time to charge the battery from the initial state to the fully charged state without interruption.

36. The battery of claim 34, wherein the rest point is in the vicinity of or above a 60% state of charge of the battery.

37. The method of claim 34, wherein the rest point is in the vicinity of or below an 80% state of charge of the battery.

38. A method for accurately estimating a capacity of a battery, comprising:
charging the battery from an initial state to a rest point prior to reaching a fully charged state;
interrupting the charging process to allow the battery to relax to a resting voltage;
measuring the resting voltage;
resuming the charging process toward the fully charged state; and
estimating the capacity of the battery based at least on the resting voltage;
wherein estimating the capacity of the battery based at least on the resting voltage involves:
computing a first state of charge of the battery corresponding to the resting voltage;
computing a second state of charge of the battery corresponding to the second resting voltage;
determining a coulomb count between the rest point and the fully charged state; and
determining the capacity of the battery based on the first state of charge, the second state of charge, and the coulomb count.

39. The method of claim 38, wherein determining the coulomb count between the rest point and the fully charged state involves:
initiating a coulomb counting from the rest point after resuming the charging process;
concluding the coulomb counting when the fully charged state is reached; and
determining the coulomb count based on the coulomb counting between the rest point and the fully charged state.

40. The method of claim 38, wherein each of the resting voltage and the second resting voltage is an open circuit voltage (OCV).

41. A battery with a capacity estimation mechanism, comprising:
a cell;
a voltage sensor configured to measure a voltage for the battery;
a current sensor configured to measure a current for the battery; and
a controller configured to receive inputs from the voltage sensor and the current sensor, and to generate a capacity estimate;
wherein the controller is configured to:
charge the battery from an initial state to a rest point prior to reaching a fully charged state;
interrupt the charging process to allow the battery to relax to a resting voltage;
measure the resting voltage;
resume the charging process toward the fully charged state; and
estimate the capacity of the battery based at least on the resting voltage;
wherein while estimating the capacity of the battery based at least on the resting voltage, the controller is configured to:
compute a first state of charge of the battery corresponding to the resting voltage;
compute a second state of charge of the battery corresponding to the second resting voltage;
determine a coulomb count between the rest point and the fully charged state; and
determine the capacity of the battery based on the first state of charge, the second state of charge, and the coulomb count.

42. The battery of claim 41, wherein while determining the coulomb count between the rest point and the fully charged state, the controller is configured to:
initiate a coulomb counting from the rest point after resuming the charging process;
conclude the coulomb counting when the fully charged state is reached; and
determine the coulomb count based on the coulomb counting between the rest point and the fully charged state.

43. The battery of claim 41, wherein each of the resting voltage and the second resting voltage is an open circuit voltage (OCV).

* * * * *